United States Patent
Kimura

(10) Patent No.: US 9,490,224 B2
(45) Date of Patent: Nov. 8, 2016

(54) SEMICONDUCTOR DEVICE AND MANUFACTURING METHOD THEREOF

(71) Applicant: Seiko Instruments Inc., Chiba (JP)

(72) Inventor: Noriyuki Kimura, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 3 days.

(21) Appl. No.: 14/150,153

(22) Filed: Jan. 8, 2014

(65) Prior Publication Data

US 2014/0117544 A1    May 1, 2014

Related U.S. Application Data

(63) Continuation of application No. 12/701,018, filed on Feb. 5, 2010, now Pat. No. 8,703,532.

(30) Foreign Application Priority Data

Feb. 6, 2009  (JP) .................................. 2009-026507
Nov. 11, 2009  (JP) .................................. 2009-258415

(51) Int. Cl.
*H01L 23/488*  (2006.01)
*H01L 23/00*  (2006.01)
(Continued)

(52) U.S. Cl.
CPC .............. *H01L 24/14* (2013.01); *H01L 21/561* (2013.01); *H01L 21/565* (2013.01); *H01L 21/568* (2013.01); *H01L 23/3107* (2013.01); *H01L 24/48* (2013.01); *H01L 24/49* (2013.01); *H01L 24/97* (2013.01); *H01L 24/45* (2013.01); *H01L 24/85* (2013.01); *H01L 2224/05554* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48465* (2013.01); *H01L 2224/48599* (2013.01);
(Continued)

(58) Field of Classification Search
CPC . H01L 33/62; H01L 23/3114; H01L 23/488; H01L 24/01; H01L 24/04; H01L 24/10; H01L 24/12; H01L 24/14
See application file for complete search history.

(56) References Cited

U.S. PATENT DOCUMENTS

2002/0033527 A1 * 3/2002 Huang et al. ................ 257/687
2003/0062631 A1    4/2003 Nemoto
(Continued)

FOREIGN PATENT DOCUMENTS

| JP | 2002-009196 A | 1/2002 |
| JP | 2006-66521 A | 3/2006 |
| WO | WO 2005/060450 A2 | 7/2005 |

*Primary Examiner* — Jae Lee
(74) *Attorney, Agent, or Firm* — Brinks Gilson & Lione

(57) ABSTRACT

A resin sealed semiconductor device includes a semiconductor element having a plurality of metal plated plastic particle core or metal particle core micro-balls including an internal terminal surface and an external connection electrode. Metal wires electrically connect the semiconductor element to the internal terminal and are bonded to the internal terminal surface by a wire bond connection coupling the metal wire to the metal plating, where the metal wire and the metal plating are different materials. A sealing body seals the semiconductor element, a part of each the plurality of the terminals, and the metal wires, where a back surface of the semiconductor element is exposed by the sealing body, and a part of each the plurality of micro-balls project from a bottom surface of the sealing body to provide the external connection electrodes.

7 Claims, 15 Drawing Sheets

(51) Int. Cl.
*H01L 21/56* (2006.01)
*H01L 23/31* (2006.01)

(52) U.S. Cl.
CPC ............ *H01L 2224/48699* (2013.01); *H01L 2224/49171* (2013.01); *H01L 2224/85001* (2013.01); *H01L 2224/97* (2013.01); *H01L 2924/01005* (2013.01); *H01L 2924/01006* (2013.01); *H01L 2924/01013* (2013.01); *H01L 2924/01019* (2013.01); *H01L 2924/01028* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/09701* (2013.01); *H01L 2924/12042* (2013.01); *H01L 2924/15787* (2013.01); *H01L 2924/181* (2013.01); *H01L 2924/1815* (2013.01); *H01L 2924/18165* (2013.01); *H01L 2924/351* (2013.01)

(56) References Cited

U.S. PATENT DOCUMENTS

| 2004/0070084 | A1* | 4/2004 | Kuramoto et al. ........... 257/779 |
| 2004/0092141 | A1 | 5/2004 | Salmon |
| 2005/0173785 | A1 | 8/2005 | Hwang et al. |
| 2005/0214980 | A1 | 9/2005 | Shiu et al. |
| 2008/0064849 | A1* | 3/2008 | Tatsuzawa et al. ........... 528/354 |
| 2008/0096312 | A1* | 4/2008 | Law ........................ H01L 23/13 438/106 |
| 2008/0308935 | A1* | 12/2008 | Kim ..................... H01L 21/565 257/738 |
| 2009/0196789 | A1 | 8/2009 | Kobayashi et al. |

* cited by examiner

Projecting portion   Back surface

Projecting portion          Back surface

SEMICONDUCTOR DEVICE AND MANUFACTURING METHOD THEREOF

RELATED APPLICATIONS

This application is a continuation application of U.S. patent application Ser. No. 12/701,018, filed Feb. 5, 2012, which claims priority under 35 U.S.C. §119 to Japanese Patent Application No. JP2009-026507, filed Feb. 6, 2009 and JP2009-258415, filed Nov. 11, 2009, the entire contents of which are hereby incorporated by reference.

BACKGROUND OF THE INVENTION

1. Field of the Invention

The present invention relates to a semiconductor device in which a semiconductor element is held. In particular, the present invention relates to a leadless type resin sealed semiconductor device and a manufacturing method for the same.

2. Description of the Related Art

In a conventional semiconductor device, in particular, a leadless type resin sealed semiconductor, a semiconductor element is mounted on a surface of a printed circuit board made of glass epoxy, ceramic, or the like. Further, the conventional semiconductor device has such a terminal structure that electrodes formed on the semiconductor element and a plurality of connecting electrodes formed on the surface of the printed circuit board are electrically connected to each other by metal wires, and external connecting terminals formed on a back surface of the printed circuit board and the respective connecting electrodes are electrically connected to each other via a conductive material disposed in a through-hole. Then, the surroundings of the semiconductor element are sealed with an insulating resin or the like, thereby constructing the semiconductor device.

Besides, there is given a semiconductor device, which is constructed through the following processes, in which: instead of using the printed circuit board made of glass epoxy, ceramic, or the like, a metal is electro-deposited on a conductive board to form a metal layer for mounting a semiconductor element and an electrode layer independently from each other on the board; after the semiconductor element is mounted on the metal layer, electrodes formed on the semiconductor element and the electrode layer are electrically connected to each other; the surroundings of the semiconductor element formed on the board is sealed with an insulating resin layer; and the board is peeled and removed from a resin sealing body to thereby obtain a sealing body in which respective back surfaces of the metal layer and the electrode layer are exposed (for example, refer to JP 2002-9196 A (FIGS. 2 and 10)).

However, the semiconductor device of this type (JP 2002-9196 A (FIG. 10)) has such a structure that a base board such as a printed circuited board or a ceramic board is incorporated in the semiconductor device, thereby being as thick as a thickness of the board due to its structure, and causing a problem of hindering an attainment of thinning of the semiconductor device. Moreover, in the printed circuit board, heat generated during the operation of the semiconductor elements easily tends to accumulate in the circuit board itself, thereby having a drawback of being inferior in heat dissipation property.

Besides, in the semiconductor device (JP 2002-9196 A FIG. 2), when external connecting electrodes are formed, there is employed a method involving peeling off and removing the bonding between a resin sealing body and the board, thereby exposing the electro-deposition layer made of a conductive metal. As a result, the electro-deposition layer becomes thin, and a bonding area between the electro-deposition layer and an insulating resin becomes smaller. Further, when peeling off the board, the electro-deposition layer is pulled by the board. Consequently, a terminal strength is lowered, and a problem arises, such as lowering of manufacturing yields or lowering in reliability after being mounted onto the print circuit board.

SUMMARY OF THE INVENTION

The present invention has been proposed to solve the above-mentioned problems, and it is an object of the invention to provide a resin sealed semiconductor device, which may be made smaller and thinner than the conventional semiconductor devices, and has excellent mounting reliability and a manufacturing method for the same.

The present invention provides, for solving the above-mentioned problems, a resin sealed semiconductor device and a method of manufacturing the same. In a semiconductor device including: a semiconductor element; a plurality of micro-balls including an internal terminal surface and an external connection electrode in two sides of the micro-balls; metal wires for electrically connecting the semiconductor element and an internal terminal surface; and a sealing body for sealing the semiconductor element, parts of the plurality of the terminals, and metal wires with a sealing resin, and is characterized in that a back surface of the semiconductor element is exposed from the sealing body, and the parts of the plurality of micro-balls are exposed as the external connection electrodes from a bottom surface of the sealing body in a projection manner.

The back surface of the semiconductor element can be formed and exposed so as to be level with the bottom surface of the sealing body.

The back surface of the semiconductor element and a part of the plurality of micro-balls can be formed and exposed so as to be level with the bottom surface of the sealing body.

The plurality of micro-balls can be formed so as to expose from an upper surface and the bottom surface of the sealing body.

External exposing portions of the plurality of micro-balls can be formed so as to project by a dimension not more than a radius of the micro-balls.

The micro-balls can be plastic balls formed by one of a single composition and a multi-layer composition subjected to metal plating selected from the group consisting of gold plating, silver plating, aluminum plating, and nickel plating.

The micro-balls can be metal balls formed of one of a single material and a lamination of various kinds of materials selected from the group consisting of gold, silver, aluminum, or nickel.

A diameter of each of the plurality of micro-balls falls within a range of 25 μm to 500 μm.

In addition, the manufacturing method includes the steps of: mounting micro-balls onto a plurality of opening portions of a sheet formed therein; mounting a semiconductor element onto a die pad portion formed in a region on the mounting side of the micro-balls except the opening portions; electrically connecting electrodes of the semiconductor element and the micro-balls through a metal wire; one-side sealing the mounting side of the semiconductor element so as to completely cover the micro-balls with an insulating resin; removing the sheet from a resin sealing body, thereby exposing a back surface portion of the semiconductor element and lower end portions of the micro-balls so as to be formed as external connection electrodes; and separating the sealing body into individual pieces of the semiconductor devices.

As described above, the semiconductor device of the present invention has such a structure that fine micro-balls mounted onto sheet mounting portions are used as terminals, and employs such a structure that the sheet, which becomes a base after the formation of the sealing body, is removed, thereby the base member such as the printed circuit board or lead frames is not incorporated into the semiconductor device. As a result, it is possible to manufacture a semiconductor device, which is thinner than the conventional ones. Further, as the printed circuit board is no used, heat generated at a time of operation of the semiconductor element does not accumulated in the board itself, heat dissipation property of the semiconductor device is enhanced.

Further, in the semiconductor device of the present invention, there is employed a method in which the sealing body and the sheet are peeled and removed, to thereby expose the external connection electrodes are exposed. As a result, the micro-balls serving as the external connection electrodes are sealed within the insulating resin to be fixed positively within the resin, whereby its connection property is hardly deteriorated when the sheet is peeled from the resin sealing body. In particular, in the semiconductor device in which micro-balls having a plastic core are used, thermal stress generated at the time of mounting between the printed circuit board and the terminals may be relaxed and buffered through elasticity of the plastic. As a result, board mounting reliability is significantly enhanced compared to the conventional ones.

Further, in the semiconductor device of the present invention, the micro-balls may be used as spacers at the time of resin sealing, thereby being capable of controlling the thickness of the semiconductor device into a desired thickness with high precision by controlling a pressure applied to the mold.

DETAILED DESCRIPTION OF THE PREFERRED EMBODIMENTS

Hereinafter, detailed descriptions are made of embodiments of a structure and a manufacturing method according to the present invention with reference to the drawings.

First Embodiment

Figure 1A:
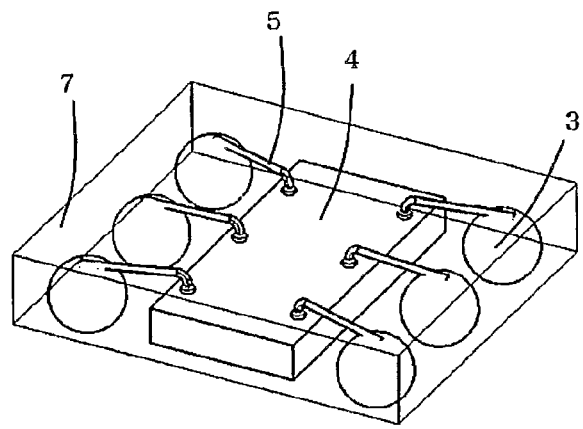
FIG. 1A is a perspective view for a schematic structure of a sealing body illustrating a structure of a semiconductor device according to the first embodiment of the present invention.
Figure 1B:
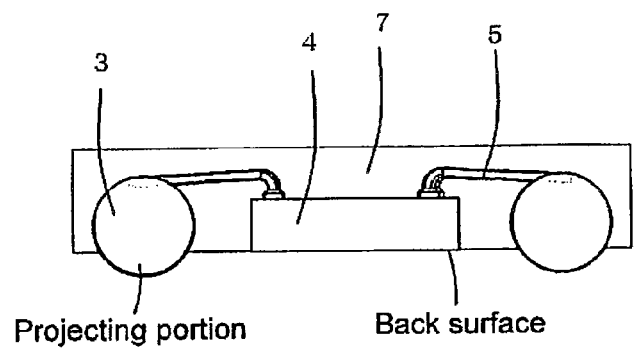
FIG. 1B is a side view illustrating a structure of a semiconductor device according to the first embodiment of the present invention.
Figure 1C:
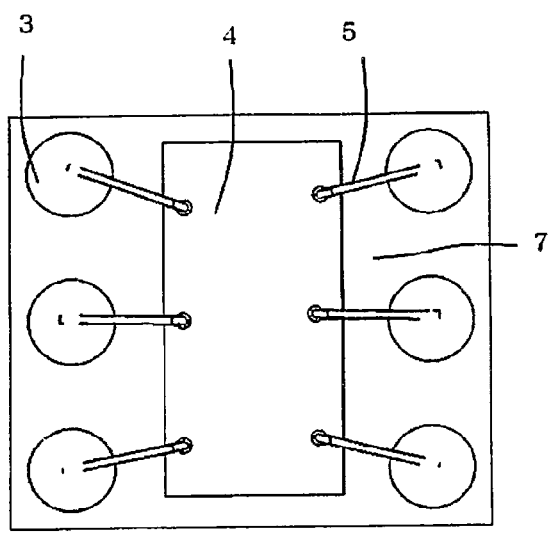
FIG. 1C is a top view illustrating a structure of a semiconductor device according to the first embodiment of the present invention.

FIGS. 1A to 1C are views illustrating a structure of a semiconductor device according to a first embodiment of the present invention, in which FIG. 1A is a perspective view illustrating a schematic structure of a sealing body, FIG. 1B is a side view, and FIG. 1C is a top view.

The semiconductor device illustrate in this embodiment is a six pin type semiconductor device having six external terminals. As illustrated in FIG. 1A, the semiconductor device includes a semiconductor element 4, conductive micro-balls 3 serving as inside-outside terminals, metal wires 5 for electrically connecting the semiconductor element 4 and the micro-balls 3, and a sealing body for sealing the semiconductor element 4, parts of the micro-balls 3, and the metal wires 5 with an insulating resin 7. As illustrated in FIG. 1B, a back surface of the semiconductor element 4 is exposed so as to be level with a bottom surface of the sealing body, and at least parts of the micro-balls 3 have, as an external terminal, an exposed portion projecting from the back surface of the sealing body. The micro-balls 3 have both roles as internal connection wirings for connecting the semiconductor element 4 inside the sealing body and external connection wirings to be used for connections with a mounting board.

Next, description is made of the semiconductor device according to the present invention by using a specific dimensional example. In this case, the semiconductor element 4, which is subjected to back-grinding so as to have 0.15 mm thickness, is used, a mounting pitch L between the micro-balls 3 is set to 0.5 mm, and a diameter of the respective micro-balls 3 is set 0.25 mm. The micro-balls used in this case are balls, which are obtained by subjecting nickel plating and then gold plating on surfaces of plastic particles (reference: "Micropearl" Registered Trademark, manufactured by Sekisui Chemical). As the metal wires 5 for electrically connecting the semiconductor element 4 and the micro-balls 3, gold wires each having a diameter of 20 μm are used. In this embodiment, there is employed an upward wiring structure in which a height of a top surface portion of the semiconductor element 4 is lower than a top surface portion of the micro-balls 3. However, depending on required dimensions and a constraint about a loop height of the metal wires 5, there may employed a structure in which the height of the top surface portion of the semiconductor element 4 is set as higher than the top surface portion of the micro-balls 3 to take a wiring mode in which the wiring is downward from the semiconductor element 4 to the top surface portion of the micro-balls 3. If a connection point of a second bonding to be connected to the micro-balls 3 is set to an apex of the top surface portion of the semiconductor element 4, pressing forces for the bonding become stable, thereby being capable of securing further connection reliability. The semiconductor device illustrated in this embodiment has a configuration in which a contour dimension thereof is 1.6 mm×1.4 mm×0.4 mm (thickness), and a stand-off is 0.05 mm.

FIGS. 3A to 3D are views for illustrating each manufacturing step of the semiconductor device according to the first embodiment of the present invention.

Figure 3A:
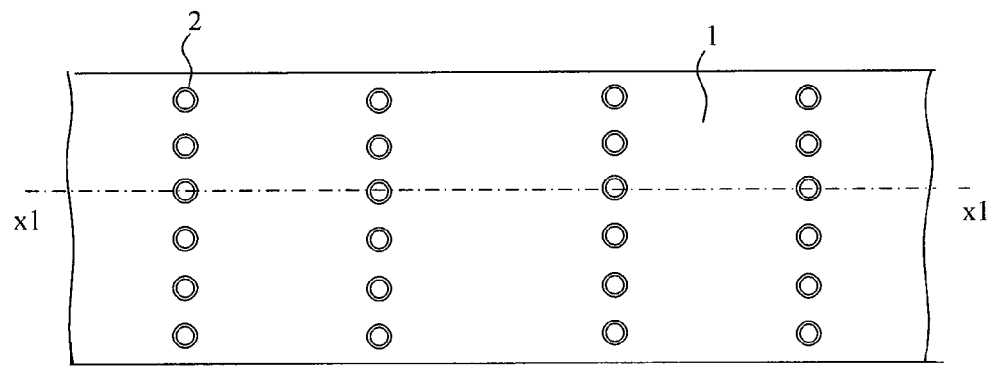
FIG. 3A is a top view and FIGS. 3B to 3D are cross-sectional views, illustrating manufacturing steps of the semiconductor device according to the first embodiment of the present invention.
Figure 3B:

First, as illustrated in FIG. 3A, a conductive metal sheet 1 such as stainless or copper, or a heat resistance rubber sheet or a resin sheet is used. For example, in a case of this embodiment, the metal sheet 1, which is made of a stainless sheet having a thickness of 1 mm, and in which columnar opening portions 2 are formed by laser processing, is prepared. The opening portion is subjected to tapering and chamfer processing is conducted thereto. In this case, FIG. 3A is a top view, and FIG. 3B is an X1-X1 cross-sectional view of FIG. 3A.

Figure 3C:

Next, as illustrated in FIG. 3C, the micro-balls 3 are mounted onto the opening portions 2 of the metal sheet 1 by a ball mounting method. The method of mounting the balls is carried out by sliding a squeegee, while sucking the opening portion, thereby mounting the ball. Alternatively, while vibrating the sheet, the balls are mounted thereto by sucking. Any one of the methods may be used. Materials of the micro-balls used in this case are balls obtained by subjecting the surfaces of the plastic particles to metal plating such as gold, silver, aluminum, or nickel, and real plating is formed by plating with a single composition, or by plating with multi-layer composition. For example, in this embodiment, balls, which are obtained by subjecting nickel plating and then gold plating on the surfaces of plastic particles (reference: "Micropearl" Registered Trademark, manufactured by Sekisui Chemical) are used. Besides, as the micro-balls 3, metal balls such as gold, silver, aluminum, or nickel may be used. The above-mentioned balls may be the one formed by laminating a single material or a various kinds of materials. The micro-balls 3 having a diameter of from 25 μm to 500 μm are used.

Figure 3D:

Next, as illustrated in FIG. 3D, the semiconductor element 4 is fixed onto the metal sheet 1 by adhesive. The fixture of the semiconductor element 4 is carried out under a state in which the micro-balls 3 are sucked and fixed onto the opening portions 2 of the metal sheet 1, or a state in which the top surfaces of all the micro-balls 3 mounted thereonto are pressed in and fixed to the opening portions, or fixed by adhesive.

Figure 4E:
FIGS. 4E to 4H are cross-sectional views illustrating manufacturing steps subsequent to the manufacturing steps of FIGS. 3A to 3D, for the semiconductor device according to the first embodiment of the present invention.

Next, as illustrated in FIG. 4E, the electrodes of the semiconductor element 4 and the micro-balls 3 are electrically connected. The connection therebetween is carried out by a wire bonding method using a gold, copper, or aluminum wire, and is carried out under the state, as described in the former paragraph, in which the micro-balls are fixed to the metal sheet 1.

Figure 4F:
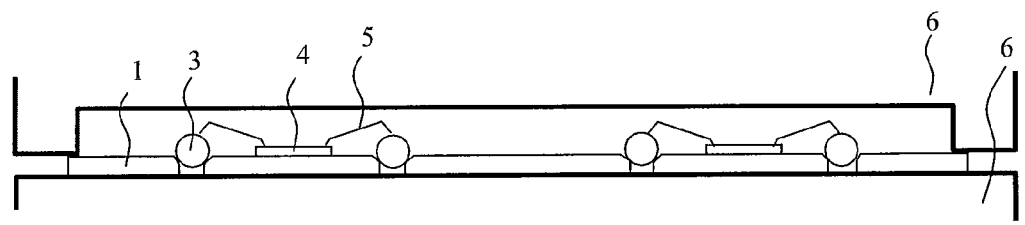
Figure 4G:
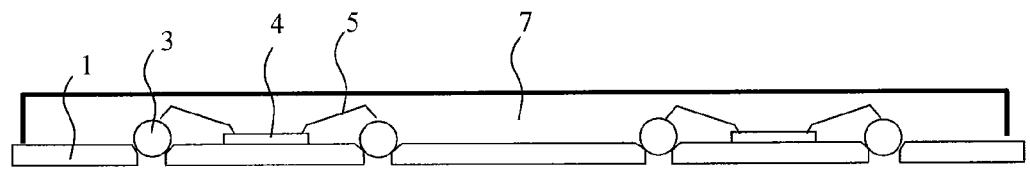

Next, the semiconductor element 4 is sealed with an insulating resin 7. As illustrated in FIG. 4F, the sealing is carried out, as described in the former paragraph, under the state in which the micro-balls are fixed to the metal sheet 1, and is carried out by a transfer molding method using an epoxy resin. If the sealing using a resin is carried out, a potting method may be used. The semiconductor device according to the first embodiment of the present invention takes, as illustrated in FIG. 4G, a mode in which the micro-balls 3 are buried within the insulating resin 7 except lower end surfaces of the balls.

Figure 4H:
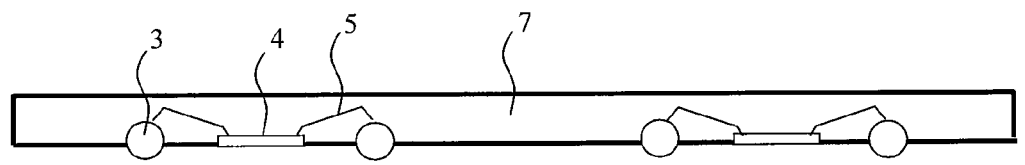

Next, after curing treatment of the resin, as illustrated in FIG. 4H, the metal sheet 1 is removed from the sealing body to expose the semiconductor element 4 and the lower end surfaces of the micro-balls, serving as the external connection electrodes. Removal of the metal sheet 1 is carried out by physical peeling, or grinding or polishing using a back grinding device, or by wet etching.

Figure 5I:
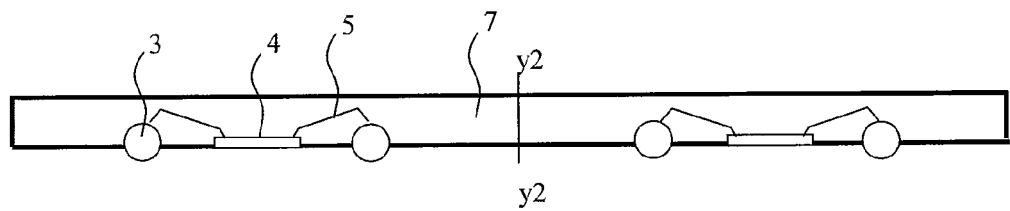
FIG. 5I is a cross-sectional view and FIG. 5J is a top view, illustrating manufacturing steps subsequent to the manufacturing steps of FIGS. 4E to 4H, for the semiconductor device according to the first embodiment of the present invention.
Figure 5J:
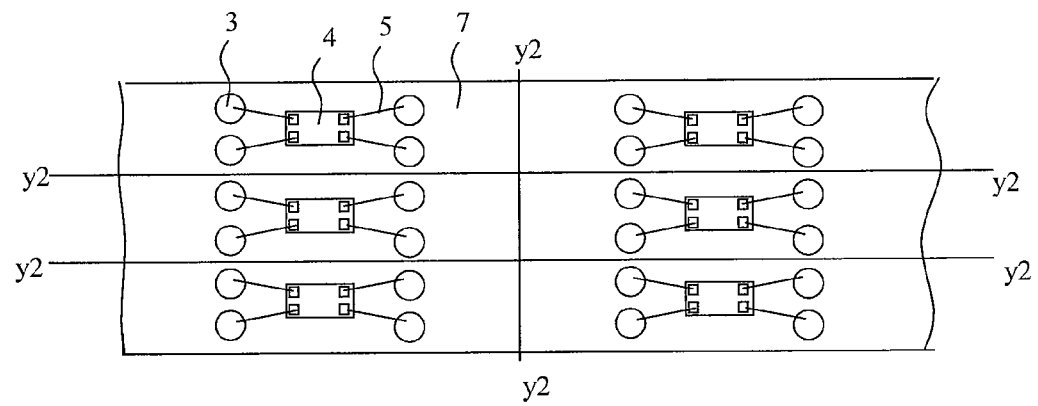
Figure 6:
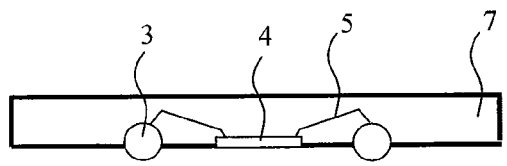
FIG. 6 is a cross-sectional view illustrating the semiconductor device according to the first embodiment of the present invention.

Next, a y2-y2 section in the cross-sectional view of the resin sealing body as illustrated in FIG. 5I and y2-y2 sections in the top view of the resin sealing body as illustrated in FIG. 5J are cut into individual pieces of the semiconductor devices by a dicing method. FIG. 6 is a cross-sectional view illustrating a final mode (configuration) of the semiconductor device according to the first embodiment of the present invention.

Second Embodiment

Figure 2A:
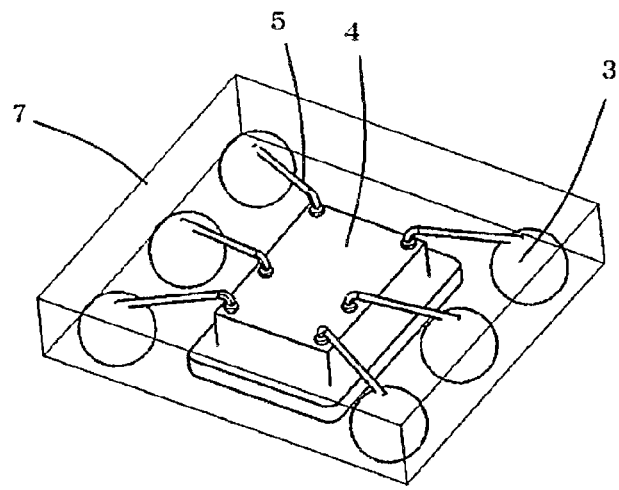
FIG. 2A is a perspective view for a schematic structure of a sealing body illustrating a structure of a semiconductor device according to the second embodiment of the present invention.
Figure 2B:
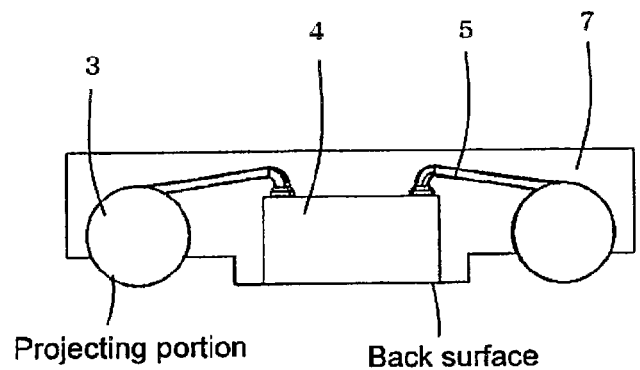
FIG. 2B is a side view illustrating a structure of a semiconductor device according to a second embodiment of the present invention.
Figure 2C:
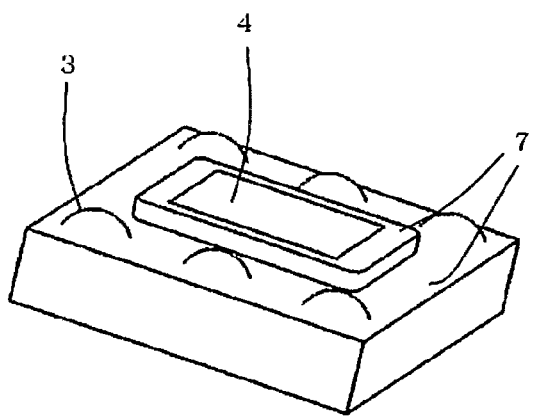
FIG. 2C is a bottom view illustrating a structure of a semiconductor device according to a second embodiment of the present invention.

FIGS. 2A to 2C are views illustrating a structure of a semiconductor device according to a second embodiment of the present invention, in which FIG. 2A is a perspective view illustrating a schematic structure of a sealing body, FIG. 2B is a side view, and FIG. 2C is a top view.

The semiconductor device illustrate in this embodiment is a six pin type semiconductor device having six external terminals. As illustrated in FIG. 2A, the semiconductor device includes a semiconductor element 4, conductive micro-balls 3 serving as inside-outside terminals, metal wires 5 for electrically connecting the semiconductor element 4 and the micro-balls 3, and a sealing body for sealing the semiconductor element 4, parts of the micro-balls 3, and the metal wires 5 with an insulating resin 7. As illustrated in FIG. 2B, a back surface of the semiconductor element 4 and at least parts of the micro-balls 3, as an external terminal, are exposed so as to be level with a bottom surface of the sealing body. The micro-balls 3 have both roles as internal connection wirings for connecting the semiconductor element 4 inside the sealing body and external connection wirings to be used for connections with a mounting board.

Next, description is made of the semiconductor device according to the present invention by using a specific dimensional example. In this case, the semiconductor element 4, which is subjected to back-grinding so as to have 0.15 mm thickness, is used, a mounting pitch L between the micro-balls 3 is set to 0.5 mm, and a diameter of the respective micro-balls 3 is set 0.25 mm. The micro-balls used in this case are balls, which are obtained by subjecting nickel plating and then gold plating on surfaces of plastic particles (reference: "Micropearl" Registered Trademark, manufactured by Sekisui Chemical). As the metal wires 5 for electrically connecting the semiconductor element 4 and the micro-balls 3, gold wires each having a diameter of 20 μm are used. In this embodiment, there is employed a upward wiring structure in which a height of a top surface portion of the semiconductor element 4 is lower than a top surface portion of the micro-balls 3. However, depending on required dimensions and a constraint about a loop height of the metal wires 5, there may employed a structure in which the height of the top surface portion of the semiconductor element 4 is set as higher than the top surface portion of the micro-balls 3 to take a wiring mode in which the wiring is downward from the semiconductor element 4 to the top surface portion of the micro-balls 3. If a connection point of a second bonding to be connected to the micro-balls 3 is set to an apex of the top surface portion of the semiconductor element 4, pressing forces for the bonding become stable, thereby being capable of securing further connection reliability. The semiconductor device illustrated in this embodiment has a configuration in which a contour dimension thereof is 1.6 mm×1.4 mm×0.4 mm (thickness), and a stand-off is 0.05 mm.

The semiconductor device according to the second embodiment of the present invention is manufactured by the same manufacturing processes as in the first embodiment before sealing with a resin.

Figure 7A:
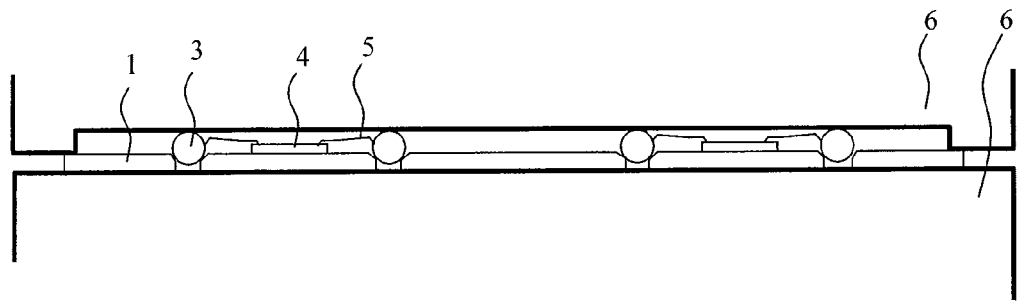
FIGS. 7A to 7C are cross-sectional views illustrating manufacturing steps of the semiconductor device according to the second embodiment of the present invention.
Figure 7B:
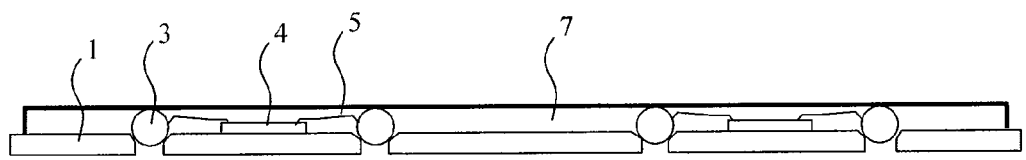

In the semiconductor device according to the second embodiment of the present invention, as in the first embodiment and as illustrated in FIG. 7A, the semiconductor element 4 is sealed with an insulating resin 7. As illustrated in FIG. 7A, upper end surfaces of the micro-balls 3 are brought into contact with a resin sealing mold (upper mold) 6, and under a state in which pressing forces are applied onto the micro-balls, a metal sheet 1 is one-side sealed with the insulating resin 7 to form the semiconductor device. In this case, the sealing is performed by a transfer molding method using an epoxy resin. The semiconductor device according to the second embodiment of the present invention takes, as illustrated in FIG. 7B, a mode in which the upper end surfaces of the micro-balls 3, which are brought into contact with the resin sealing mold, are exposed.

Figure 7C:
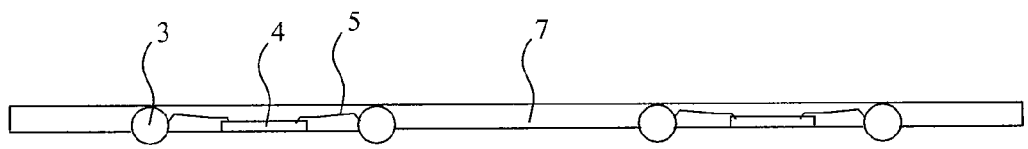

Next, after curing treatment of the resin, as in the first embodiment and as illustrated in FIG. 7C, the metal sheet 1 is removed from the sealing body to expose the semiconductor element 4 and the lower end surfaces of the micro-balls, serving as the external connection electrodes. Removal of the metal sheet 1 is carried out by physical peeling, or grinding or polishing using a back grinding device, or by wet etching. In the semiconductor device of the second embodiment of the present invention, external connection electrodes are exposed to the upper and lower surfaces of the semiconductor device.

Figure 8D:
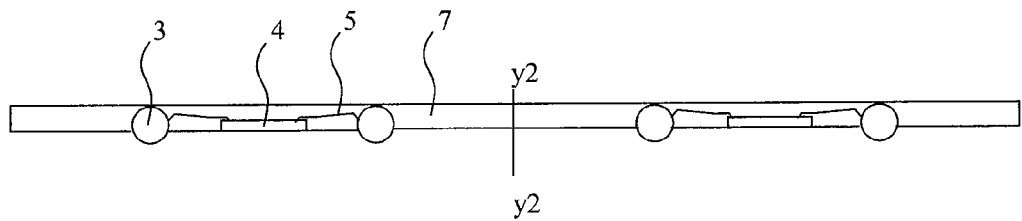
FIG. 8D is a cross-sectional view.
Figure 8E:
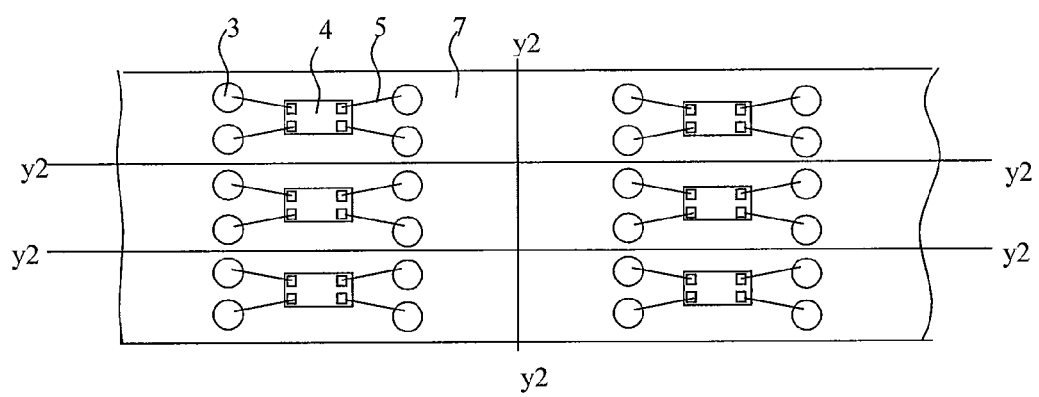
FIG. 8E is a top view and FIG. 8F is a cross-sectional view, illustrating manufacturing steps subsequent to the manufacturing steps of FIGS. 7A to 7C, for the semiconductor device according to the first embodiment of the present invention.
Figure 8F:
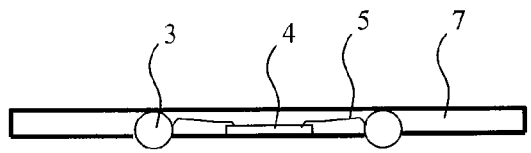

Next, a y2-y2 section in the cross-sectional view of the resin sealing body as illustrated in FIG. 8D and y2-y2 sections in the top view of the resin sealing body as illustrated in FIG. 8E are cut into individual pieces of the semiconductor devices by a dicing method. FIG. 8F illustrates a final mode (cross-sectional view) of the semiconductor device according to the second embodiment of the present invention.

Third Embodiment

FIGS. 9A to 9D are views for illustrating each manufacturing step of the semiconductor device according to a third embodiment of the present invention.

Figure 9A:
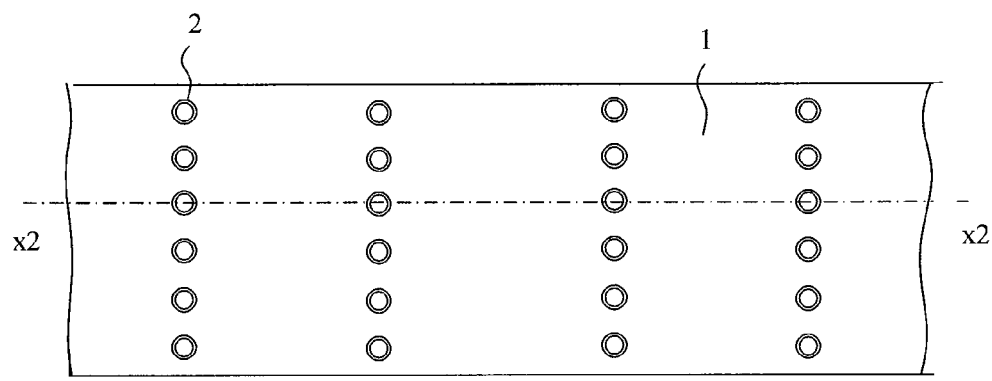
FIG. 9A is a top view and FIGS. 9B to 9D are cross-sectional views, illustrating manufacturing steps of a semiconductor device according to a third embodiment of the present invention.
Figure 9B:

First, as illustrated in FIG. 9A, a conductive metal sheet 1 such as stainless or copper, or a heat resistance rubber sheet or a resin sheet is used. For example, in a case of this embodiment, columnar opening portions 2 are formed in a copper sheet having a thickness of 0.08 mm by press working using a punch. The opening portions are subjected to tapering and chamfer processing may be conducted thereto. In this case, FIG. 9A is a top view, and FIGS. 9B to 9D are cross-sectional views in process order, which are taken along the line x2-x2 of FIG. 9A.

Figure 9C:
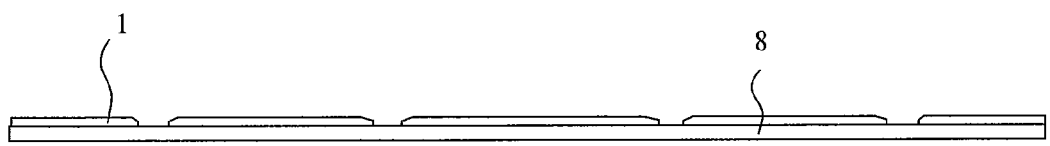

Next, as illustrated in FIG. 9C, a UV tape 8 is attached to a surface opposite to the surface of the metal sheet 1 having tapers formed therein.

Figure 9D:
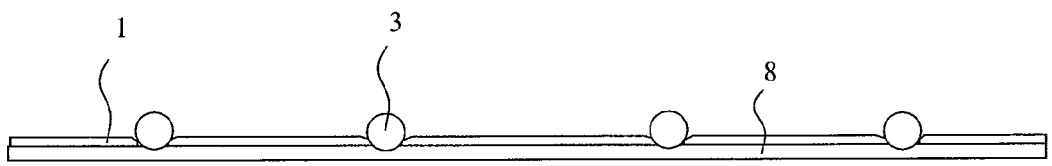

Next, as illustrated in FIG. 9D, the micro-balls 3 are mounted onto the opening portions 2 of the metal sheet 1 by vibrating the metal sheet 1, or by sliding a squeegee. Materials of the micro-balls used in this case are balls obtained by subjecting the surfaces of the plastic particles to metal plating such as gold, silver, aluminum, or nickel. Real plating is formed by plating with a single composition, or by plating with multi-layer composition. For example, in this embodiment, balls, which are obtained by subjecting nickel plating and then gold plating on the surfaces of plastic particles (reference: "Micropearl" Registered Trademark, manufactured by Sekisui Chemical) are used. In place of the plastic particle, a metal particle such as copper or nickel is used as a core, and as the micro-balls 3, metal balls subjected to plating by a single composition such as gold, silver, aluminum, nickel, or palladium, or the metal balls subjected to multi-layer plating may be used. The micro-balls 3 having a diameter of from 25 μm to 500 μm are used.

Figure 10E:
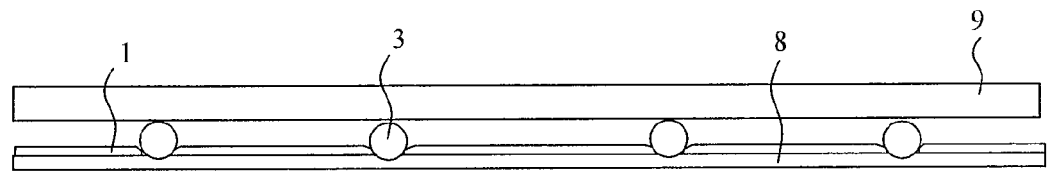
FIGS. 10E to 10H are cross-sectional views illustrating manufacturing steps subsequent to the manufacturing steps of FIGS. 9A to 9D, for the semiconductor device according to the third embodiment of the present invention.
Figure 10F:

Next, as illustrated in FIG. 10E, the upper surface portion of the micro-balls 3 are pressed by a roller 9, to thereby fix the micro-balls 3, as illustrated in FIG. 10F, into an adhesive portion of a tape.

Figure 10G:
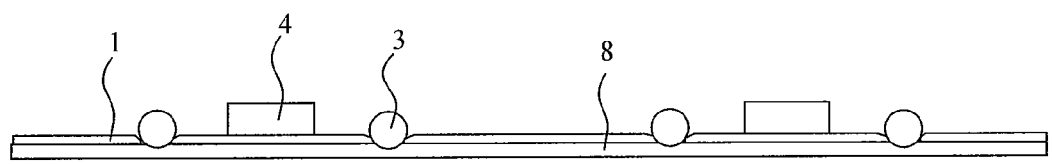

Next, as illustrated in FIG. 10G, the semiconductor element 4 is fixed onto the metal sheet 1 via an adhesive material (not shown).

Figure 10H:
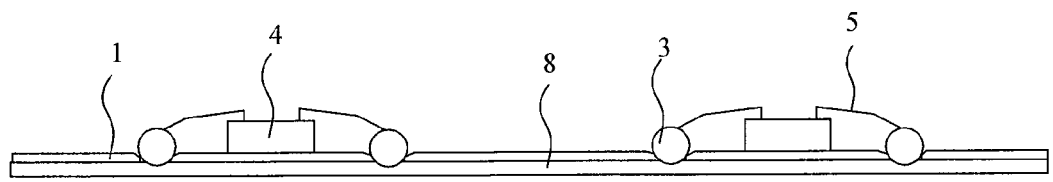

Next, as illustrated in FIG. 10H, the electrodes and the micro-balls 3 are electrically connected. The connection therebetween is carried out by a wire bonding method using a gold, copper, or aluminum wire, and is carried out under the state, as described in the former paragraph, in which the micro-balls are fixed to the metal sheet 1 via the tape 8. In this case, a gold wire of 20 μm is used.

Figure 11I:
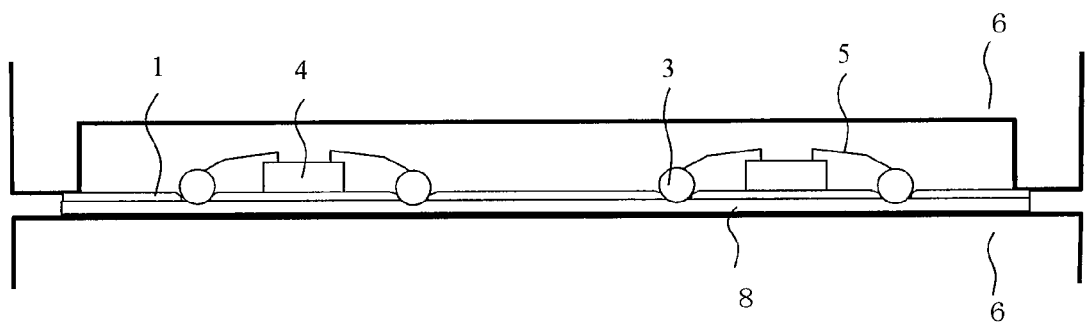
FIGS. 11I to 11K are cross-sectional views illustrating manufacturing steps subsequent to the manufacturing steps of FIGS. 10E to 10H, for the semiconductor device according to the third embodiment of the present invention.
Figure 11J:
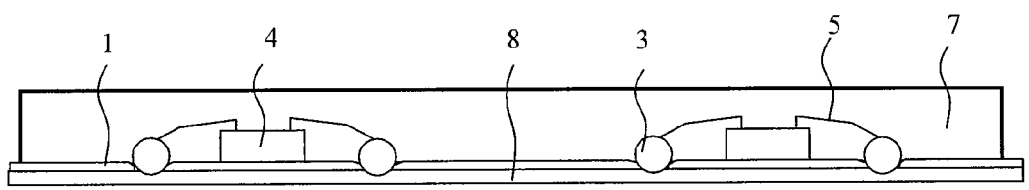

Next, the semiconductor element 4 is sealed with an insulating resin 7. As illustrated in FIG. 11I, the sealing is carried out, as described in the former paragraph, under the state in which the micro-balls are fixed to the metal sheet 1 via the tape 8, and is carried out by a transfer molding method by injecting an insulating resin 7 into a resin sealing mold 6. If the sealing using the insulating resin is carried out, a potting method may be used in place of the transfer molding method. The semiconductor device according to the third embodiment of the present invention takes, as illustrated in FIG. 11J a mode in which the micro-balls 3 are buried within the insulating resin 7 except lower end surfaces of the balls.

Figure 11K:
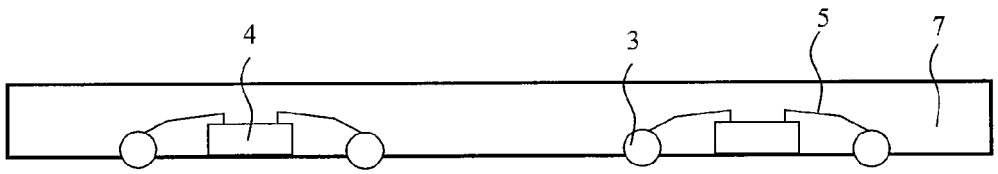

Next, after curing treatment of the resin, as illustrated in FIG. 11K, the metal sheet 1 and the tape 8 is removed from the sealing body to expose the semiconductor element 4 and the lower end surfaces of the micro-balls 3, serving as the external connection electrodes. Removal of the metal sheet 1 is carried out by physical peeling, or grinding or polishing using a back grinding device, or by wet etching.

Figure 12L:
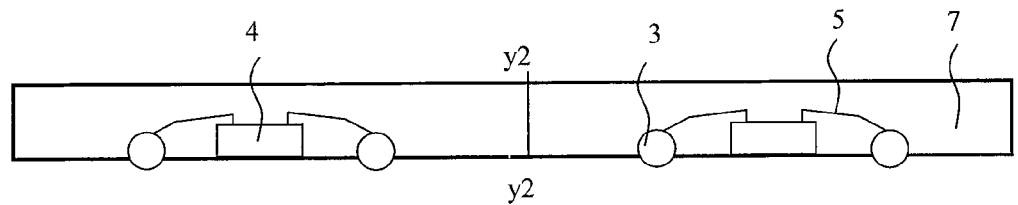
FIG. 12L is a cross-sectional view.
Figure 12M:
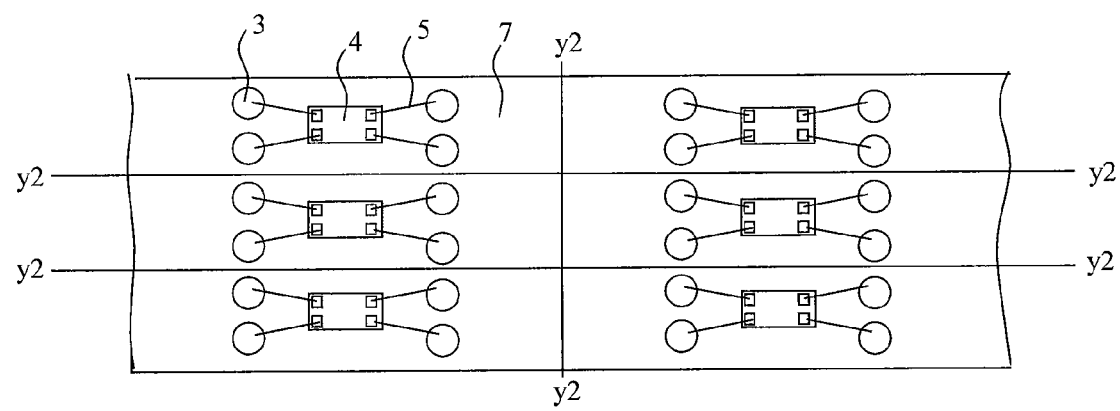
FIG. 12M is a top view and FIG. 12N is a cross-sectional view, illustrating manufacturing steps subsequent to the manufacturing steps of FIGS. 11I to 11K, for the semiconductor device according to the third embodiment of the present invention.
Figure 12N:
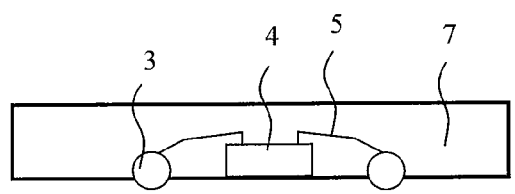

Next, a y2-y2 section in the cross-sectional view of the resin sealing body as illustrated in FIG. 12L and y2-y2 sections in the top view of the resin sealing body as illustrated in FIG. 12M are cut into individual pieces of the semiconductor devices by a dicing method. FIG. 12N illustrates a final mode (cross-sectional view) of the semiconductor device according to the third embodiment of the present invention.

Fourth Embodiment

FIGS. 13A to 13D are views for illustrating each manufacturing step of the semiconductor device according to a fourth embodiment of the present invention.

Figure 13A:
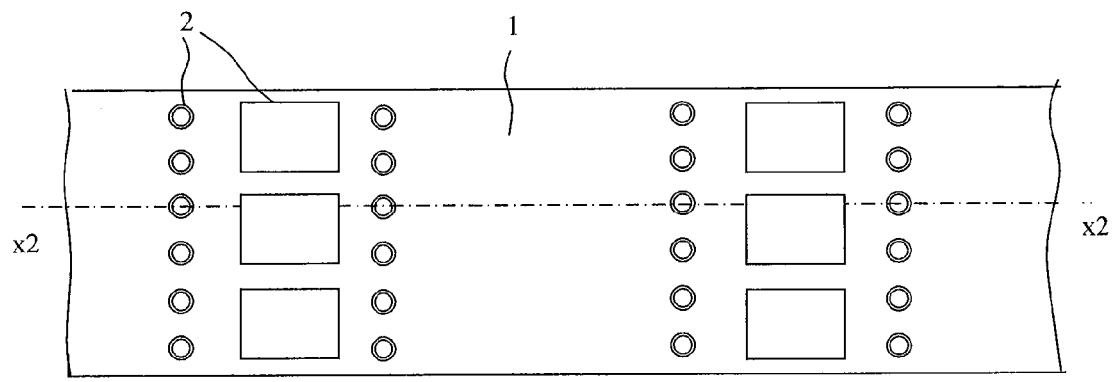
FIGS. 13A to 13D are a top view and cross-sectional views for illustrating manufacturing steps of a semiconductor device according to a fourth embodiment of the present invention.
Figure 13B:

First, as illustrated in FIG. 13A, a conductive metal sheet 1 such as stainless or copper, or a heat resistance rubber sheet or a resin sheet is used. For example, in a case of this embodiment, columnar and square opening portions 2 are formed in a copper sheet having a thickness of 0.08 mm by press working using a punch. The opening portions are subjected to tapering and chamfer processing may be conducted thereto. In this case, FIG. 13A is a top view, and FIGS. 13B to 13D are cross-sectional views in process order, which are taken along the line x2-x2 of FIG. 13A.

Figure 13C:
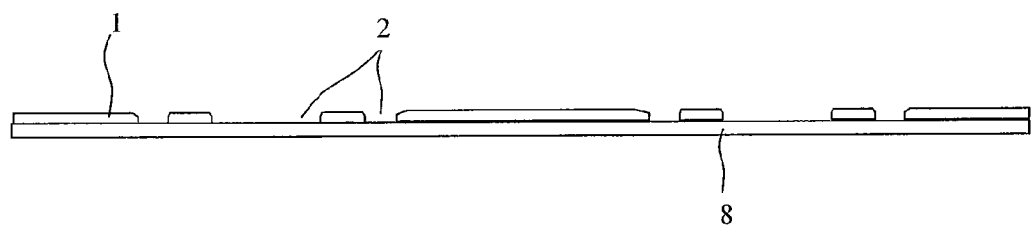

Next, as illustrated in FIG. 13C, a UV tape 8 is attached to a surface opposite to the surface of the metal sheet 1 having tapers formed therein.

Figure 13D:
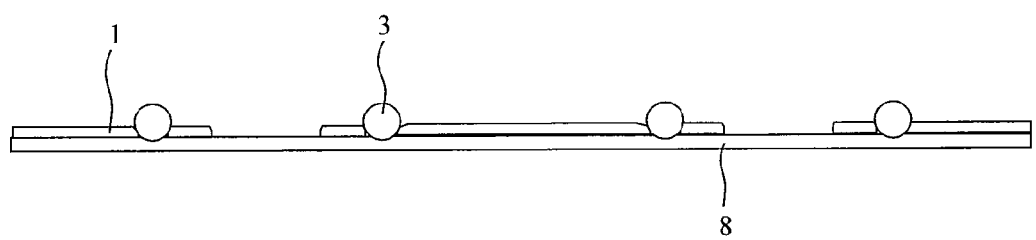

Next, as illustrated in FIG. 13D, the micro-balls 3 are mounted onto the columnar opening portions 2 by a ball mounting method. Materials of the micro-balls used in this case are balls obtained by subjecting the surfaces of the plastic particles to metal plating such as gold, silver, aluminum, or nickel. Real plating is formed by plating with a single composition, or by plating with multi-layer composition. For example, in this embodiment, balls, which are obtained by subjecting nickel plating and then gold plating on the surfaces of plastic particles (reference: "Micropearl" Registered Trademark, manufactured by Sekisui Chemical) are used. In place of the plastic particle, a metal particle such as copper or nickel is used as a core, and as the micro-balls 3, metal balls subjected to plating by a single composition such as gold, silver, aluminum, nickel, or palladium, or the metal balls subjected to multi-layer plating may be used. The micro-balls 3 having a diameter of from 25 μm to 500 μm are used.

Figure 14E:
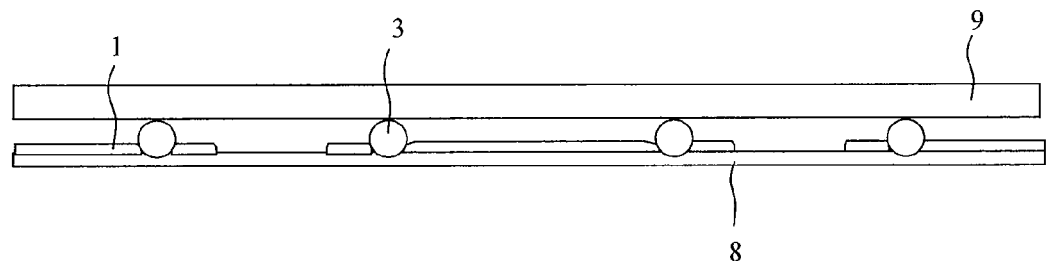
FIGS. 14E to 14H are cross-sectional views for illustrating manufacturing steps subsequent to the manufacturing steps of FIGS. 13A to 13D, for the semiconductor device according to the fourth embodiment of the present invention.
Figure 14F:
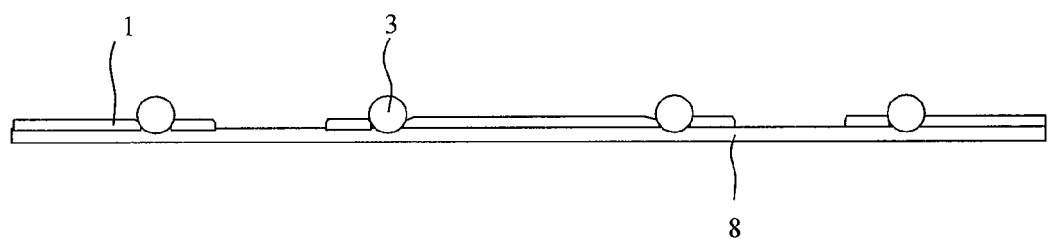

Next, as illustrated in FIG. 14E, the upper surface portion of the micro-balls 3 are pressed by a roller 9, to thereby fix the micro-balls 3, as illustrated in FIG. 14F, into an adhesive portion of a tape.

Figure 14G:
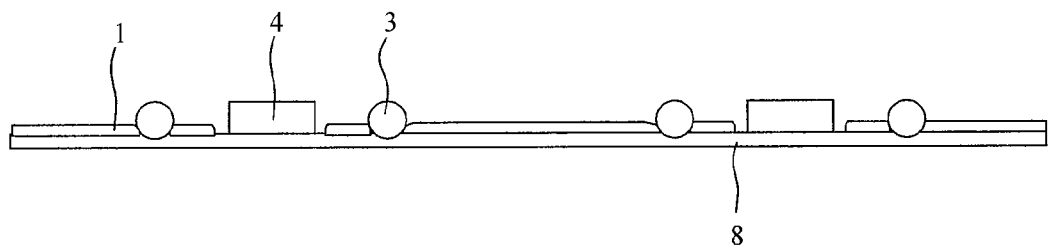

Next, as illustrated in FIG. 14G, the semiconductor element 4 is connected via the square opening portions 2 by a tape 8.

Figure 14H:
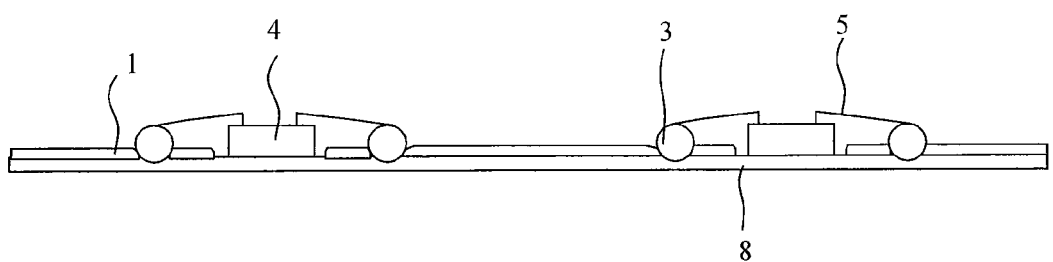

Next, as illustrated in FIG. 14H, the electrodes and the micro-balls 3 are electrically connected. The connection therebetween is carried out by a wire bonding method using a gold, copper, or aluminum wire, and is carried out under the state, as described in the former paragraph, in which the micro-balls are fixed to the metal sheet 1 via the tape 8. In this case, a gold wire of 20 μm is used.

Figure 15I:
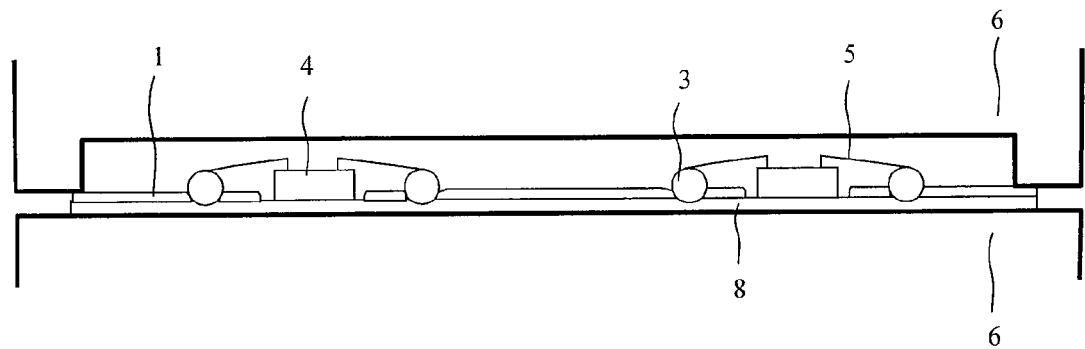
FIGS. 15I to 15K are cross-sectional views for illustrating manufacturing steps subsequent to the manufacturing steps of FIGS. 14E to 14H, for the semiconductor device according to the fourth embodiment of the present invention.
Figure 15J:
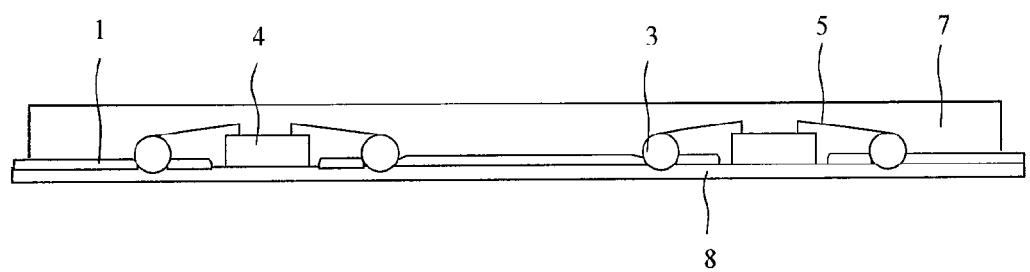

Next, the semiconductor element 4 is sealed with an insulating resin 7. As illustrated in FIG. 15I, the sealing is carried out, as described in the former paragraph, under the state in which the micro-balls are fixed to the metal sheet 1 via the tape 8, and is carried out by a transfer molding method by injecting an insulating resin 7 into a resin sealing mold 6. If the sealing using the insulating resin is carried out, a potting method may be used in place of the transfer molding method. The semiconductor device according to the third embodiment of the present invention takes, as illustrated in FIG. 15J a mode in which the micro-balls 3 are buried within the insulating resin 7 except lower end surfaces of the balls.

Figure 15K:
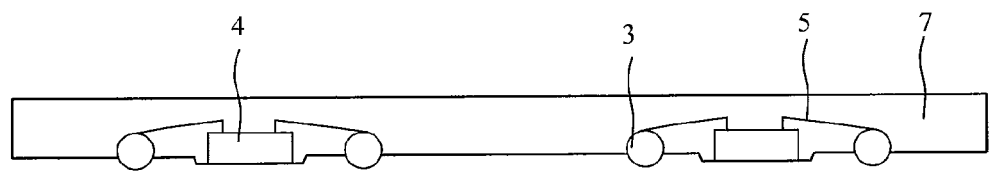

Next, after curing treatment of the resin, as illustrated in FIG. 15K, the metal sheet 1 and the tape 8 is removed from the sealing body to expose the semiconductor element 4 and the lower end surfaces of the micro-balls 3, serving as the external connection electrodes. Removal of the metal sheet 1 is carried out by physical peeling, or grinding or polishing using a back grinding device, or by wet etching.

Figure 16L:
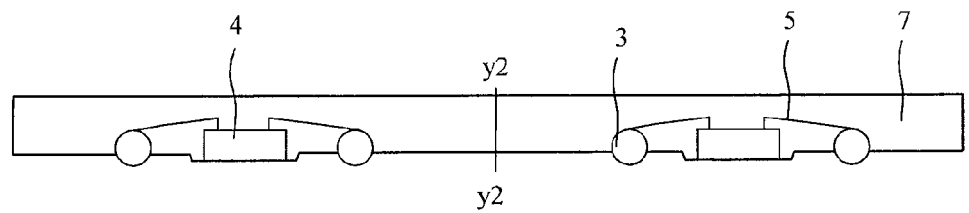
FIG. 16L is a cross-sectional view.
Figure 16M:
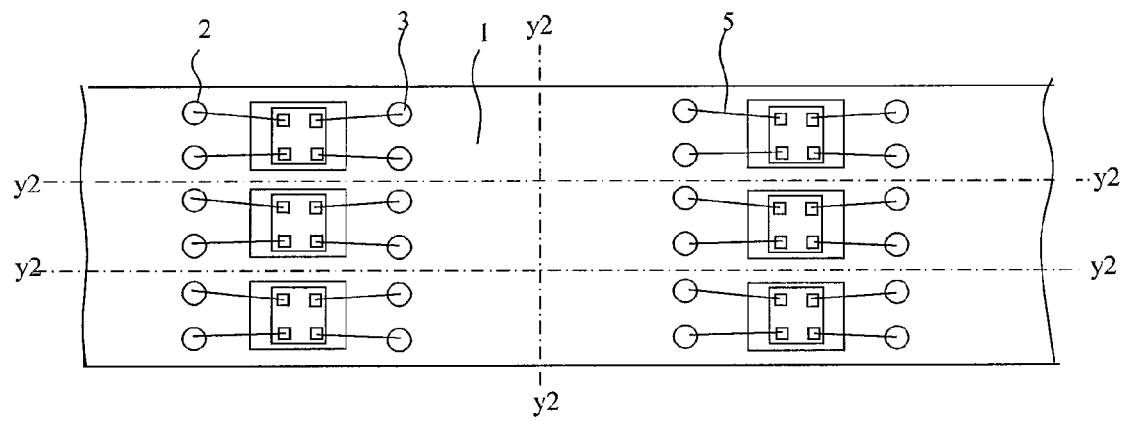
FIG. 16M is a top view and FIG. 16N is a cross-sectional view, illustrating manufacturing steps subsequent to the manufacturing steps of FIGS. 15I to 15K, for the semiconductor device according to the fourth embodiment of the present invention.
Figure 16N:
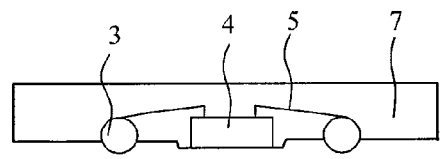

Next, a y2-y2 section in the cross-sectional view of the resin sealing body as illustrated in FIG. 16L and y2-y2 sections in the top view of the resin sealing body as illustrated in FIG. 16M are cut into individual pieces of the semiconductor devices by a dicing method. FIG. 16N illustrates a final mode (cross-sectional view) of the semiconductor device according to the fourth embodiment of the present invention.

The invention claimed is:

1. A resin sealed semiconductor device comprising:
a semiconductor element;
a plurality of micro-balls independently arrayed and having a predetermined pitch in a periphery of the semiconductor element,
wherein the micro-balls each comprise a plastic particle core or metal particle core completely covered by a metal plating defining a spherical perimeter surface thereof;
a metal wire electrically connecting the semiconductor element to an internal terminal surface comprising a first portion of the spherical perimeter surface of the metal plating of each of the plurality of micro-balls,
wherein the metal wire is bonded to the internal terminal surface by a wire bond connection coupling the metal wire to the metal plating on the spherical perimeter surface; and
a sealing body that seals the semiconductor element, a substantial portion of each of the plurality of micro-balls, and the metal wire with a sealing resin,
wherein a back surface of the semiconductor element is exposed by the sealing body, and a second portion of the metal plating of each of the plurality of micro-balls is exposed only at a bottom surface of the sealing body and a portion of the spherical perimeter surface projects from the bottom surface to provide an external connection electrode, and
wherein the back surface of the semiconductor element and the lowermost contact portion of the spherical perimeter surface of the plurality of micro-balls are exposed and on a same horizontal plane with the bottom surface of the sealing body.

2. A resin sealed semiconductor device according to claim 1, wherein the back surface of the semiconductor element is exposed and is level with the bottom surface of the sealing body.

3. A resin sealed semiconductor device according to claim 1, wherein the plurality of micro-balls comprise a plastic core, and the metal plating is selected from the group consisting of gold plating, silver plating, aluminum plating, or nickel plating, and the metal plating comprises one of a single composition or a multi-layer composition.

4. A resin sealed semiconductor device according to claim 1, wherein the plurality of micro-balls comprise a metal core selected from the group consisting of copper or nickel, and the metal plating comprises gold plating, silver plating, aluminum plating, or nickel plating, and the metal plating comprises one of a single composition or a multi-layer composition.

5. A resin sealed semiconductor device according to claim 1, wherein the wire comprises one of gold, copper, or aluminum wire.

6. A resin sealed semiconductor device according to claim 1, wherein the bottom surface of the sealing body extends in a lateral direction and includes first and second portions connected by a vertical surface and the semiconductor element is exposed at the first portion and the spherical perimeter surface of the plurality of micro-balls are exposed at the second portion.

7. A resin sealed semiconductor device comprising:
a semiconductor element;
a plurality of micro-balls independently arrayed and having a predetermined pitch in a periphery of the semiconductor element,
wherein the micro-balls each comprise a plastic particle core or metal particle core completely covered by a metal plating defining a spherical perimeter surface thereof;
a metal wire electrically connecting the semiconductor element to an internal terminal surface comprising a first portion of the spherical perimeter surface of the metal plating of each of the plurality of micro-balls,
wherein the metal wire is bonded to the internal terminal surface by a wire bond connection coupling the metal wire to the metal plating on the spherical perimeter surface; and
a sealing body for sealing the semiconductor element, a region of each of the plurality of micro-balls, and the metal wire with a sealing resin,
wherein a back surface of the semiconductor element is exposed by the sealing body, and a second portion of the metal plating of each of the plurality of micro-balls is exposed at a bottom surface of the sealing body and a portion of the spherical perimeter surface projects from the bottom surface to provide an external connection electrode, and,
wherein the plurality of micro-balls are exposed from an upper surface and the bottom surface of the sealing body.

* * * * *